United States Patent [19]

Blickstein et al.

[11] Patent Number: 4,733,198
[45] Date of Patent: Mar. 22, 1988

[54] MECHANICALLY TUNABLE SEALED MICROWAVE OSCILLATOR

[75] Inventors: Martin J. Blickstein, Austell, Ga.; Lynn Carpenter, State College, Pa.

[73] Assignee: Murata Erie North America, Inc., Smyrna, Ga.

[21] Appl. No.: 915,574

[22] Filed: Oct. 6, 1986

[51] Int. Cl.$^4$ .............................................. H03B 5/18
[52] U.S. Cl. .................................. 331/96; 331/117 D; 331/177 R; 333/235
[58] Field of Search ................ 331/96, 99, 107 DP, 331/107 SL, 117 D, 117 FE, 177 R; 333/219, 221, 231, 235

[56] References Cited

U.S. PATENT DOCUMENTS

| | | | |
|---|---|---|---|
| 3,680,002 | 7/1972 | Quine | 331/96 |
| 3,702,971 | 11/1972 | Kawamoto | 330/57 |
| 3,882,420 | 5/1975 | Liu | 331/99 |
| 4,019,161 | 4/1977 | Kimura et al. | 331/107 DP X |
| 4,511,860 | 4/1985 | Bastida et al. | 331/96 |
| 4,628,283 | 12/1986 | Reynolds | 331/96 X |
| 4,639,690 | 1/1987 | Lewis | 331/96 |

Primary Examiner—Siegfried H. Grimm
Attorney, Agent, or Firm—Thomas & Kennedy

[57] ABSTRACT

A microwave oscillator has a sealed, dielectric case that encloses a dielectric resonator adjacent a circuit conductor. Discrete conductive elements are removably mounted to the exterior of the case within a magnetic field generatable by the resonator. The oscillator may be tuned by selectively removing the discrete conductive elements from the case.

10 Claims, 8 Drawing Figures

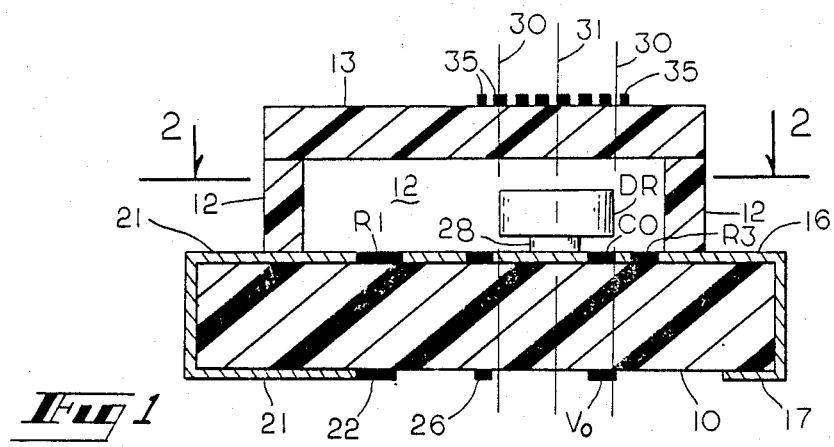
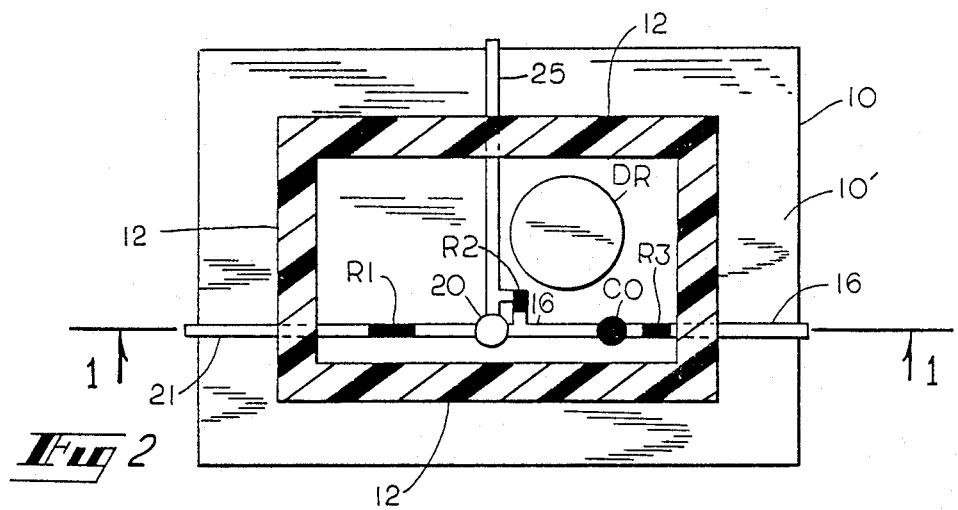
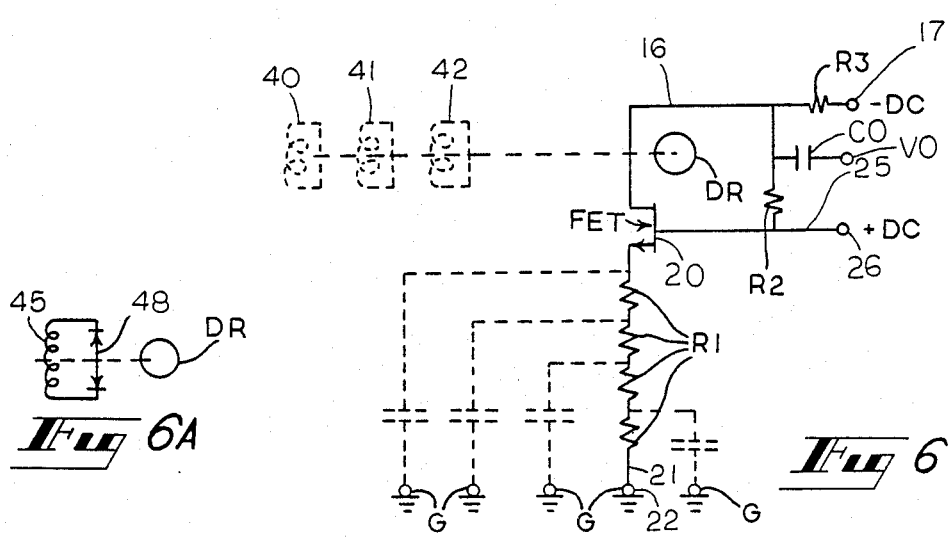

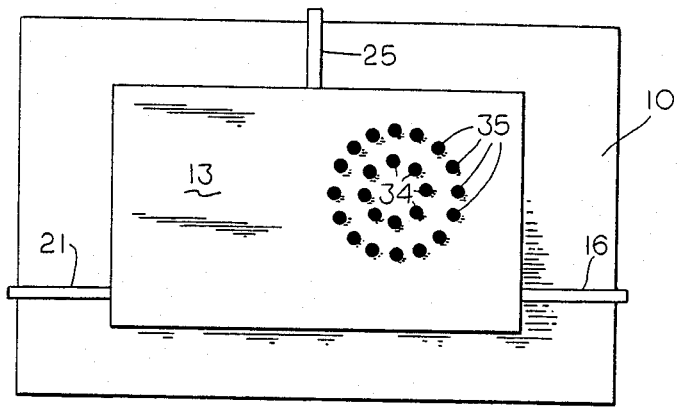
Fig 3
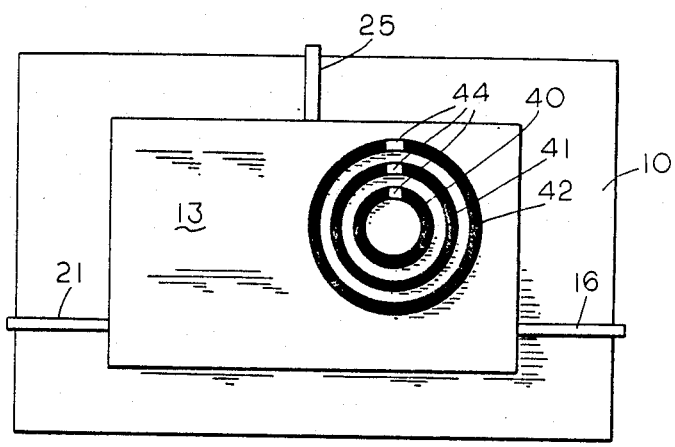
Fig 4
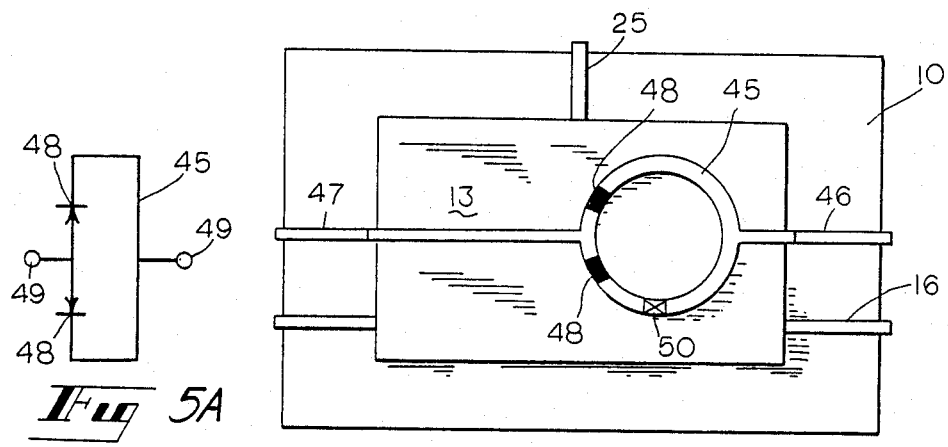
Fig 5A
Fig 5

MECHANICALLY TUNABLE SEALED MICROWAVE OSCILLATOR

TECHNICAL FIELD

This invention relates generally to microwave oscillators, and particularly to microwave oscillators of the type whose frequency may be adjusted.

BACKGROUND OF THE INVENTION

As shown in U.S. Pat. Nos. 3,680,002, 3,702,971 and 3,882,420, microwave oscillators may be tuned in several ways. For example, they may be tuned by altering electrical capacitance or by altering induced magnetic field flux densities.

Some microwave oscialators employ a small slab of dielectric material, referred to as a dielectric resonator, adjacent an electrical conductor in order to create resonance at a selected frequency of current carried by the conductor. The resonant frequency of the dielectric resonator is dependent upon the geometry of the conductors within its vicinity. This fact has been used in devising means for manually adjusting the resonant frequency as by turning a conductive screw or the like so as to alter its proximity or orientation with respect to the dielectric resonator.

Today, microwave oscillators have become miniaturized and designed to be used as surface mounted devices (SMD). This miniaturization has made it highly desirable to have the oscillators hermetically sealed so that moisture and airborne particles may not effect their operation. This reduction in scale and attendant requirement for sealing has made it extremely difficult to devise practical means for tuning the oscillators. For example, mechanically tuning the devices by moving a conductor in the vicinity of a dielectric resonator, or another conductor within the oscillator, is highly impractical and unreliable in itself since extremely small changes in position are required and since vibrations tend to reposition the movable conductor.

Hermetically sealing presents further design difficulties. For example, one could consider placing the oscillator within an expandable bellows that bears conductive members but such would tend to "microphone" when vibrated. One could tune oscillators electronically as with the use of varactors. However, this produces low Q resonance since varactors tend to load oscillator circuits. Frequency multipliers could also be used but they are complex, expensive and generally unreliable.

Accordingly, it is seen that a strong need exists today for sealed, tunable, microwave oscillators that could be practically used as surface mounted devices and which could be externally tuned in a simple, predictable and reliable manner. It is to the provision of such an oscillator therefore that the present invention is primarily directed.

SUMMARY OF THE INVENTION

In one form of the invention a mechanically tunable, sealed, microwave oscillator comprises an hermetically sealed dielectric case through which a conductor extends to ambience for exterior circuit connection. A dielectric resonator is mounted within the case adjacent the conductor for generation of an electromagnetic field that extends through the case upon excitation by current flow at microwave frequencies through the conductor. At least one conductive element is removably mounted to the exterior of the case within the field, the removal of which serves to adjust the resonant frequency of the dielectric resonator and thereby tune the oscillator.

In another form of the invention, a frequency adjustable, sealed microwave oscillator comprises an hermetically sealed dielectric case having a dielectric constant less than 10 through which a conductor extends to ambience for circuit connection. A generally cylindrical dielectric resonator having a dielectric constant greater than 20 is mounted within the case adjacent the conductor for generation of an electromagnetic field that extends through the case upon excitation by current flow at microwave frequencies through the conductor. The dielectric resonator occupies a segment of a cylindrical spatial boundary through which the axis of the cylindrical resonator centrally extends. At least one conductive element is removably mounted to the exterior of the oscillator within the cylindrical spatial boundary, the removal of which serves to adjust the resonant frequency of the dielectric resonator and thereby adjust the operational frequency of the oscillator.

BRIEF DESCRIPTION OF THE DRAWING

FIG. 1 is a transverse, cross-sectional view taken along plane 1—1 of a microwave oscillator embodying principles of the present invention while FIG. 2 is a top view, taken in partial cross-section along plane 2—2, of the oscillator illustrated in FIG. 1.

FIG. 3 is a plan view of the microwave oscillator of FIGS. 1 and 2.

FIG. 4 is a plan view of a microwave oscillator embodying principles of the invention in another preferred form.

FIG. 5 is a plan view of a microwave oscillator embodying principles of the invention in yet another form while FIG. 5A is a circuit diagram of a circuit in the oscillator of FIG. 5.

FIG. 6 is a circuit diagram of the microwave oscillator illustrated in FIG. 4 while FIG. 6A is a circuit diagram of an alternative to the circuit of FIG. 5A.

DETAILED DESCRIPTION

With reference next to the drawing, there is shown in FIGS. 1–3 a microwave oscillator that comprises a dielectric case formed with material having a dielectric constant preferably less than 10 which includes a slab-shaped base 10 upon the upper surface of which is mounted four walls 12 the tops of which are covered by a cover 13. The case is formed so as to be hermetically sealed by conventional techniques.

The oscillator is provided with electrically conductive lines which are metallized upon surfaces of the base 10 in a manner rendering the oscillator a surface mountable device. Specifically, the oscillator is seen to have a conductive line 16 that extends from a —DC terminal 17 located upon the bottom surface of the case base 10 then along a side of the base, over an upper ledge 10' of the base, beneath a wall 12 and into the interior of the case. Within the case the line 16 is serially joined to a resistor R3, to one plate of a capacitor CO and to the drain of a field effect transistor (FET) 20. The other plate of capacitor CO is formed on the bottom of the base 10 as a terminal VO.

The oscillator circuitry includes another conductive line 21 that extends from a ground (G) terminal 22 along the bottom surface of the base 10, then along a side of the base and over the upper surface of the ledge 10', beneath a wall 12 and into the interior of the case serially to a resistor R1 and to the source of the field effect transistor 20. The oscillator circuitry further includes another conductive line 25 that extends from a plus DC terminal 26 formed upon the bottom of the case base 10, along another side of the base, over the ledge 10' and beneath the wall 12 to the gate of the field effect transistor 20 and via another resistor R2 to line 16.

A cylindrically shaped dielectric resonator DR, having a dielectric constant preferably greater than 20 is rigidly mounted within the interior of the case upon a ceramic pedestal 28 adjacent the conductive lines 16 and 25. The resonator is seen to occupy a portion of a cylindrical spatial boundary 30 as shown in FIG. 1 with the axis of the cylindrical dielectric resonator centrally located therewithin.

Upon the exterior surface of the cover 13 is removably mounted two sets 34 and 35 of discrete, conductive elements. The set 34 is seen to be composed of 8 elements arranged in an annular formation within the spatial, cylindrical boundary 30 while the set 35 is seen to be composed of 16 elements arranged in an annular formation slightly outside of the boundary 30.

For operation the oscillator is mounted as a conventional SMD upon a circuit board or the like with its terminals connected to extrinsic circuitry. Upon energization with passage of current of a microwave frequency through the conductive lines 16 and 25 the dielectric resonator DR resonates and thereby produces an electromagnetic field that is concentrated adjacent to and within the spatial boundary 30. The frequency of resonance of the dielectric resonator is dependent upon the geometry of conductors within its electromagnetic field. As the conductive elements 34 and 35 are located sufficient close to the resonator and its generated field, which extends substantially unloaded through the dielectric case, the presence of the conductive elements 34 and 35 effect the frequency of its resonance. Thus, by selectively removing some of the elements 34/35 the resonant frequency of the dielectric resonator may be changed. Adjustment of the resonant frequency of the dielectric resonator in turn causes the operational frequency of the oscillator itself to be changed. In this manner it is seen that the oscillator may be easily mounted as an SMD to a circuit and then tuned by merely manually removing selective members of the sets of the conductive elements.

The number, location, size and shape of the discrete conductive elements mounted to the exterior of the oscillator can be quite varied. They can, for example, be of very small slab-like or cylindrical shaped elements as shown in FIGS. 1-3 located primarily within the electromagnetic field generated by the dielectric resonator. The distance between the elements and the dielectric resonator would also alter the effect of an element but with the present invention this distance is normally fixed. Alterations in the thickness of the elements, i.e. their height as viewed in FIG. 1, tend to have nominal effect. For this reason the elements are preferably constructed to be entirely removed from their dielectric substrate.

As previously stated, preferably the elements should be in or near to the spatial bounday within which the resonator lays. Were an element, for example, to be placed on the outer surface of a side wall 12 it would have very little potential effect due to the geometry of the magnetic field produced by the resonator which is concentrated within and along the spatial boundary 30. The location of conductive elements within the field however does have an effect. For example, the choice of a single conductive element being located substantially along the axis 31 of the resonator or adjacent the boundary 30 is important for locating one conductive element along the axis of the resonant frequency of the oscillator rather than adjacent the boundary 30 is productive of a higher frequency of resonance initially. Therefore, its removal would cause a greater drop in resonant frequency than would removal of an element located nearer the boundary 30. If desired, the conductive elements may be arranged in two concentric annular formations with the number of discrete elements selected such that removal of one from an inner formation may cause a frequency change of 10 MHz while removal of one from the outer formation may produce a frequency change of but 1 MHz. Thus, the oscillator may come with an instruction sheet which renders it easy on a base 10 numerical system to adjust the oscillator frequency prior to surface mounting. Alternatively, the oscillator may be incorporated into an active circuit, and the frequency then adjusted while observing the effect that occurs as discrete elements are removed until the desired operational frequency of the oscillator is reached.

With reference next to FIG. 4 an alternative embodiment is shown of the same structure as that of the embodiment of FIGS. 1-3 with the exception of the construction and disposition of the conductive elements mounted atop the surface of the cover 13. The conductive elements here are seen to constitute three conductive rings 40, 41 and 42 that are rigidly mounted atop the cover concentric with the axis 31. Each of these conductive rings is seen to include a segment 44 that may be manually removed from the cover. The reason for this configuration is based on an application of Lenz's Law. Under Lenz's Law a counter electromagnetic field is developed by eddy currents in a conductor located within an electromagnetic field. In the case of a closed loop (ring) eddy current flow within a conductor is substantially enhanced where the conductor is in the shape of a closed circuit. Thus, by selectively removing one of the breachable segments 44 of one or more of the conductive rings, a very pronounced adjustment can be made in the resonant frequency of the dielectric resonator due to the significant reduction achieved in the counter effect created by current flow in the remaining portions of the rings.

FIGS. 5 and 5A show yet another embodiment which is of the same construction as that of FIGS. 1 and 2 with the exception again of the shape and design of the conductive element mounted upon the cover which here extends onto the base 10. Here, a conductive ring 45 is mounted upon the cover 13 adjacent the boundary 30 of the dielectric resonator housed within the case. The ring is connected by lines 46 and 47 to terminals 49 mounted on the bottom of the base 10. Incorporated within the ring 45 are two diodes 48. An identified segment 50 of one semi-circular leg of the ring is breachable and manually removable. With this construction current flow through ring 45 may be controlled by the polarity of the voltage placed across terminals 49. This is to say that with one polarity no current flows through the ring 45 while with the other polarity current does flow through the ring and thus creates a substantial electromagnetic field counter to that produced by the dielectric resonator. In addition, removal of the segment 50 may serve to decrease the effect provided by one leg of the ring as hereinbefore explained. If desired, this circuit may be used to augment other, unshown elements that are removably mounted to the cover adjacent the ring 45. Furthermore, the lines 46 and 47 and terminals 49 may be eliminated, as shown schematically in FIG. 6A, so that only eddy current flow is producible. Here again a segment of the circuit of FIG. 6A is removable.

Finally, FIG. 6 is a circuit diagram of the microwave oscillator illustrated in FIG. 4. Here R1 is diagrammed in an elongated, segmented form to show the distributive capacitance between it and the ground (G) terminal 22 through the dielectric case base 10 which distributive capacitance is represented by the distinct capacitors shown in broken lines. The rings 40, 41 and 42 are also shown here as broken lined, closed loop inductors.

It thus is seen that an oscillator is provided of a type that may be used as an SMD and which is sealed and yet mechanically tunable in a very reliable and predictable manner. It should be understood however that the just described embodiments merely illustrate principles of the invention in preferred forms. Many modifications, additions, and deletions may be made thereto without departure from the spirit and scope of the invention as set forth in the following claims.

We claim:

1. A mechanically tunable sealed, microwave oscillator comprising an hermetically sealed dielectric case through which a conductor extends to ambience for external circuit connection, a dielectric resonator mounted within said case adjacent said conductor for generation of an electromagnetic field that extends through said case upon resonator excitation by current flow at microwave frequencies through said conductor, and a set of conductive elements removably mounted to the exterior of said case the selective removal of which serves to adjust the resonant frequency of the dielectric resonator.

2. A mechanically tunable sealed, microwave oscillator comprising an hermetically sealed dielectric case through which a conductor extends to ambience for external circuit connection, a dielectric resonator mounted within said case adjacent said conductor for generation of an electromagnetic field that extends through said case upon resonator excitation by current flow at microwave frequencies through said conductor, at least one conductive element removably mounted to the exterior of said case within the field the removal of which serves to adjust the resonant frequency of the dielectric resonator and thereby tune the oscillator, and wherein said conductive element forms a removable segment of a conductive loop mounted to the exterior of said case.

3. The oscillator of claim 2 wherein said conductive loop includes a pair of diodes, and wherein a pair of terminal lines is connected to said loop whereby current may be selectively passed through the loop to generate a back electromagnetic force field in tuning the dielectric resonator.

4. A mechanically tunable sealed, microwave oscillator comprising an hermetically sealed dielectric case through which a conductor extends to ambience for external circuit connection, a dielectric resonator mounted within said case adjacent said conductor for generation of an electromagnetic field that extends through said case upon resonator excitation by current flow at microwave frequencies through said conductor, and at least one conductive element removably mounted to the exterior of said case within the field the removal of which serves to adjust the resonant frequency of the dielectric resonator and thereby tune the oscillator, and wherein said dielectric resonator is generally right circular cylindrical and wherein said conductive element is mounted to said case within space bounded by a cylindrical extension of said cylindrical resonator.

5. The oscillator of claim 4 comprising a set of conductive elements mounted to said case within said space.

6. A frequency adjustable, sealed, microwave oscillator comprising an hermetically sealed dielectric case having a dielectric constant less than 10 through which a conductor extends to ambience for circuit connection, a substantially cylindrical dielectric resonator having a dielectric constant greater than 20 mounted within said case adjacent said conductor for generation of an electromagnetic field that extends through said case upon resonator excitation by current flow at microwave frequencies through said conductor, said dielectric resonator occupying a segment of a cylindrical spatial boundary through which the axis of the cylindrical resonator centrally extend, and a set of discrete conductive elements removably mounted to the exterior of said oscillator within said cylindrical spatial boundary the removal of which serves to adjust the resonant frequency of the dielectric resonator and thereby adjust the operational frequency of the oscillator.

7. The oscillator of claim 6 wherein at least some of said elements are annularly arrayed about said resonator axis.

8. The oscillator of claim 7 wherein others of said conductive elements are annularly arrayed about said resonator within said some elements array.

9. A frequency adjustable, sealed, microwave oscillator comprising an hermetically sealed dielectric case having a dielectric constant less than 10 through which a conductor extends to ambience for circuit connection, a substantially cylindrical dielectric resonator having a dielectric constant greater than 20 mounted within said case adjacent said conductor for generation of an electromagnetic field that extends through said case upon resonator excitation by current flow at microwave frequencies through said conductor, said dielectric resonator occupying a segment of a cylindrical spatial boundary through which the axis of the cylindrical resonator centrally extends, and at least one conductive element removably mounted to the exterior of said oscillator within said cylindrical spatial boundary, the removal of which serves to adjust the resonant frequency of the dielectric resonator and thereby adjust the operational frequency of the oscillator, and wherein said conductive element forms a removable segment of a conductive loop mounted to the exterior of said oscillator within said spatial boundary.

10. The oscillator of claim 9 wherein said conductive loop comprises a pair of diodes and wherein a pair of terminal lines is connected to said loop so as to provide an on/off conductive line through said spatial boundary and the magnetic field.

* * * * *